United States Patent [19]

Ljung

[11] 4,370,583
[45] Jan. 25, 1983

[54] PIEZOELECTRIC MOTOR FOR DITHERING RING LASER GYROSCOPES

[75] Inventor: Bo H. G. Ljung, Wayne, N.J.

[73] Assignee: The Singer Company, Little Falls, N.J.

[21] Appl. No.: 225,490

[22] Filed: Jan. 16, 1981

[51] Int. Cl.³ ............................................ H01L 41/08
[52] U.S. Cl. .................................. 310/331; 310/367; 310/366; 356/350
[58] Field of Search ............... 310/328, 367, 330–332, 310/368, 366; 356/350

[56] References Cited

U.S. PATENT DOCUMENTS

| | | | |
|---|---|---|---|
| 3,167,667 | 1/1965 | Lukso | 310/331 X |
| 3,225,226 | 12/1965 | Kawakami | 310/331 |
| 3,304,773 | 2/1967 | Rogallo | 310/331 X |
| 3,748,503 | 7/1973 | Cobarg et al. | 310/331 |
| 3,760,203 | 9/1973 | Guntersdorfer et al. | 310/331 X |
| 4,113,387 | 9/1978 | Shutt | 310/332 X |
| 4,160,184 | 7/1979 | Ljung | 310/331 X |
| 4,167,686 | 9/1979 | Fukuyo | 310/368 X |

*Primary Examiner*—Mark O. Budd
*Attorney, Agent, or Firm*—John C. Altmiller; Thomas W. Kennedy

[57] ABSTRACT

A transducer for driving a spoke of a ring laser gyroscope is fastened at a point of neutral radius on the spoke. The transducer may be a piezoelectric crystal provided with a pair of electrodes which are driven in push-pull by an AC voltage to dither the gyroscope.

7 Claims, 4 Drawing Figures

PIEZOELECTRIC MOTOR FOR DITHERING RING LASER GYROSCOPES

BACKGROUND OF THE INVENTION

This invention relates to an improved piezoelectric motor for use in dither drives for ring laser gyroscopes. More particularly, this invention relates to improvements in the motor and in the piezoelectric transducers used as actuators in such motors.

Piezoelectric motors have been used in the past for the purpose of dithering ring laser gyroscopes. In one such motor, one or more piezoelectric transducers are fastened to flexible spokes connecting the outer movable rim of the gyroscope to an inner, fixed hub. The transducers are driven by a suitable AC voltage and bend together, moving the outer rim back and forth in an oscillatory motion. In this known structure, the transducers are attached to a heavily stressed region near the hub of the spoke by means of an adhesive which is subject to failure, during operation of the motor, because of the high stress. Also, because of the high stress, very thin piezoelectric elements must be used in the transducers, making the motor structure expensive.

A second drawback in this design is the fact that one side of the transducer is necessarily grounded to the spoke to which it is attached. The transducer drive currents, passing through to ground, cause error voltages to appear in other circuits which use the same ground. In some cases, this problem may be so severe as to necessitate the use of an isolation transformer for driving the motor. Such an isolation transformer is heavy and is particularly undesirable when the ring laser gyroscope is to be used in air-borne navigation equipment.

It is an object of the present invention to provide a piezoelectric motor for driving ring laser gyroscopes which is free of the above disadvantages.

SUMMARY OF THE INVENTION

According to the invention, the center of each piezoelectric transducer which forms an actuator of the drive motor is attached to the associated spoke at a point of "neutral radius" in such a way that the portion of the transducer nearer the hub and the portion of the transducer nearer the movable outer rim of the gyroscope are subject to substantially equal and opposite strains when the spoke and transducer are flexed. The outside surface of the piezoelectric element forming the active portion of the tranducer is provided with two separate electrodes, called inner and outer electrodes, while the side of the transducer fastened to the spoke has a single back electrode. The inner and outer electrodes are driven oppositely by the application of AC voltage. By driving the inner and outer electrode in push-pull with an AC voltage, a symmetrical drive is achieved and the back electrode remains at a virtual ground potential. The alternating voltage causes the respective ends of the transducer to bend into a succession of S-shapes and results in motion of the outer rim back and forth.

The ends of the piezoelectric element are tapered to reduce the effect of stresses at the ends of the element; failure and degradation of the element in these regions are thus minimized. Because the need for a good electrical contact between the spoke and the transducer is eliminated, the transducer can be bonded to the spoke with a high structural strength adhesive on a carrier. Thus, thicker transducer elements can be used and the problem of delamination which occurred with prior art devices is eliminated. This results in reduced losses from handling of the thicker elements. Finally, the use of a back electrode held at virtual ground potential, results in a balanced design which eliminates ground currents and permit use of light-weight push-pull amplifiers in place of isolation transformers.

DETAILED DESCRIPTION OF THE INVENTION

Figure 1:
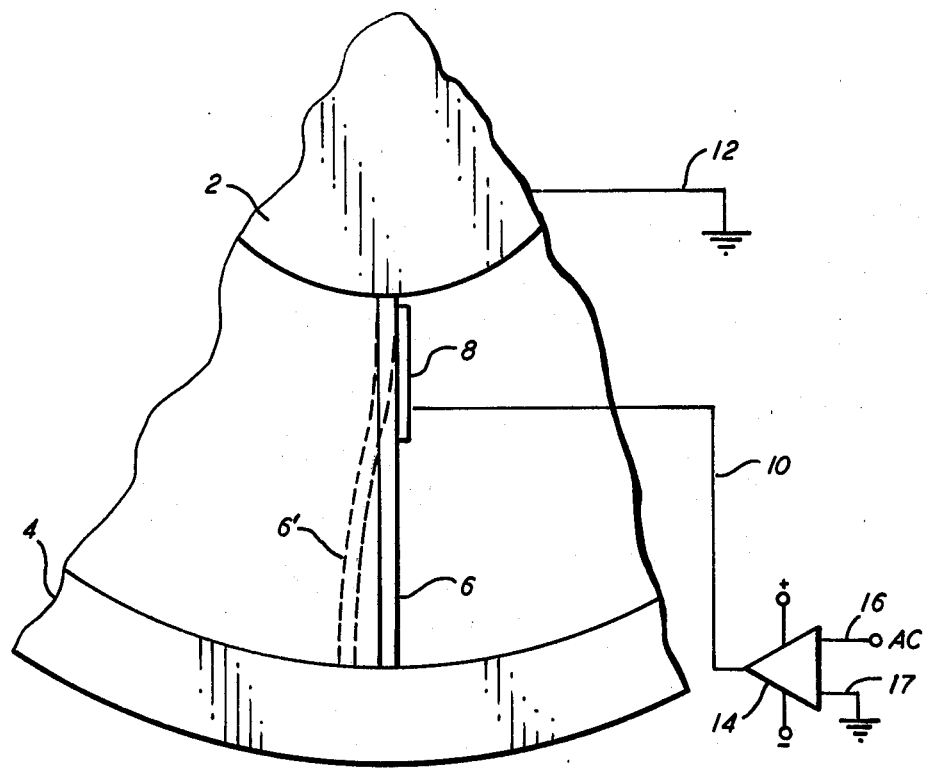
FIG. 1 is a schematic showing of a prior art piezoelectric drive motor.
Figure 2:
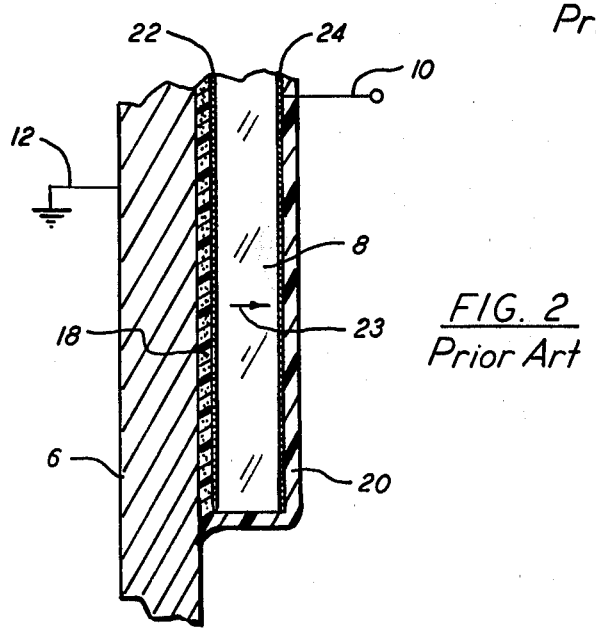
FIG. 2 is a view in cross-section of a portion of the structure of FIG. 1.

FIGS. 1 and 2 illustrate a prior art piezoelectric motor for dithering a ring laser gyroscope. The gyroscope has a fixed hub 2 and a movable outer rim 4 which is connected to hub 2 by means of a number of radial spokes 6. Only one spoke is illustrated. The motive element comprises a piezoelectric transducer 8, electrically and mechanically bonded to spoke 6 near hub 2, which is driven by means of a voltage supplied, via connecting leads 10 and 12, from amplifier 14. A second transducer (not shown) can be attached to the other side of the spoke. An AC voltage, applied to input 16 of amplifier 14, is amplified and applied to opposite sides of transducer 8 to produce deflection of spoke 6. In FIG. 1 the return connection is via spoke 6, hub 2, and ground 12. The ground return path is a shared one; it also serves as a return line for other signals in the gyroscope which are not related to the dither drive. The alternating voltage impressed on transducer 8 causes it to elongate and compress in alternation. This change in length is communicated to the spoke, producing deflection and ultimate deformation of the spoke as shown by the dashed lines 7.

As shown, one transducer is attached to one side of one spoke. It will be understood by those skilled in the art that more than one spoke may be driven, and that transducer may be placed on both sides of a given spoke. In accordance with prior art practice, FIG. 1 shows the customary placement of transducer 8 at a position close to the inner, fixed hub 2, where the spoke is quite heavily stressed. While the bending of the spoke is not, in practice, as great as suggested in FIG. 1 by the solid and dashed positions 6 and 7, respectively, nevertheless there is substantial flexing of the spoke which is communicated to the transducer element itself and causes it to bend. In order to avoid failure due to bending, this structure therefore requires the use of piezoelectric transducer elements which are quite thin.

FIG. 2 shows, in greater detail, the prior art manner of attachment of the transducer to spoke 6. There, transducer element 8 is seen as having electrodes 22 and 24 on either longitudinal face. These electrodes are formed in place by coating the transducer element with, for example, a silver paste which is then fired to produce conductive surfaces on the element. Electrical connection is made between inner silver electrode 22 and metal spoke 6 of the gyroscope by means of a layer of conducting epoxy 18. Epoxy 18 may be either aluminum, silver or gold filled. The assembly is completed by covering transducer 8 with a conformal coating 20 which effectively seals and insulates the transducer from atmospheric effects. Conformal coating 20 may be a silicone, epoxy, shellac, or other well-known insulating compound. The bodies of transducer 8 may be made of any material possessing piezoelectric properties. Such a material may be a ceramic. A preferred material is strontium doped lead-zirconium-titanate. The direction of prepolarization of the transducer element are shown by arrow 23. Arrow 23 also indicates the direction of application of the electric field between electrodes 22 and 24 for producing a deformation of the transducer element.

Figure 4:
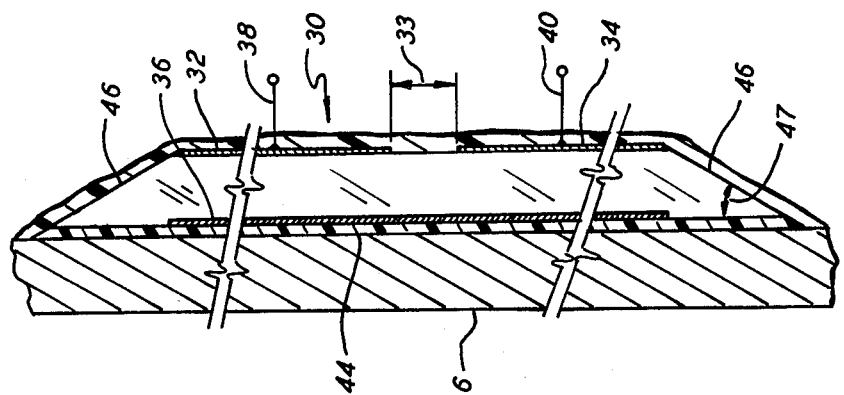
FIG. 4 is a view in cross-section, of a piezoelectric drive motor according to the invention.
Figure 3:
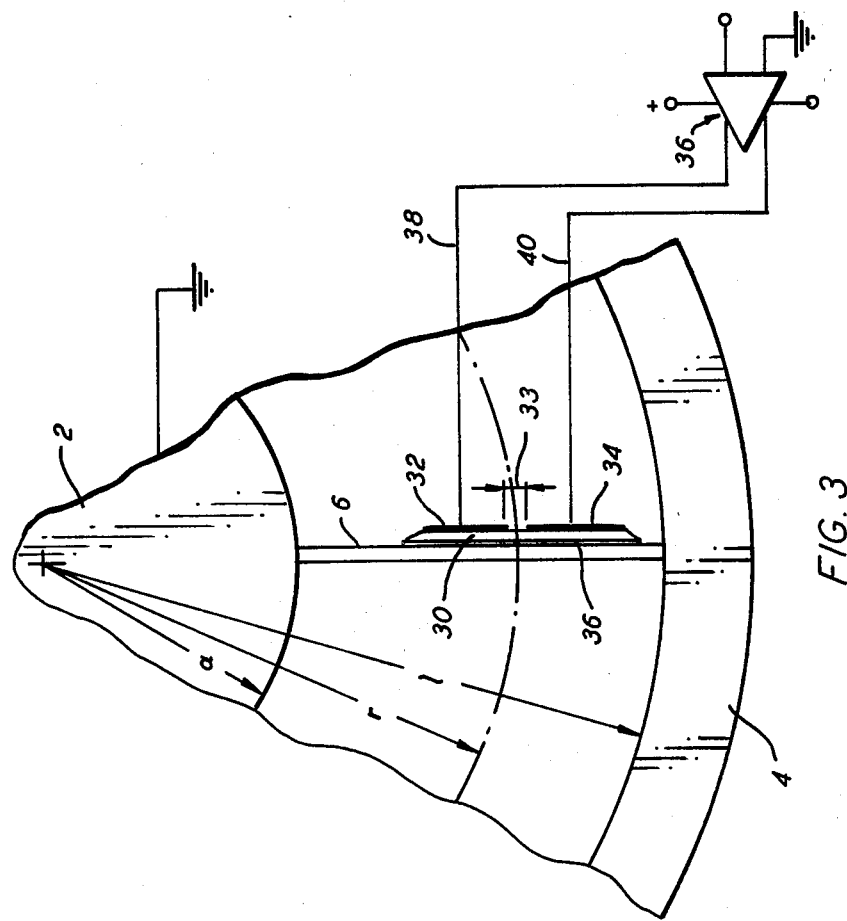
FIG. 3 is a schematic side view, of a piezoelectric motor in accordance with the teachings of the invention.

FIGS. 3 and 4 illustrate a piezoelectric drive motor fabricated according to the teachings of the invention.

As before, the motor is illustrated as having a single transducer bonded to one side of spoke 6 between stationary ring laser gyro hub 2 and movable outer rim 4. Transducer element 30 now carries two electrodes 32 and 34, spaced apart from each other on the side of element 30 away from spoke 6. Electrodes 32 and 34 are connected to amplifier 36 by means of connecting leads 38 and 40, respectively. Amplifier 36 has a push-pull output supplying AC voltage to connecting leads 38 and 40. As indicated in FIG. 3, electrodes 32 and 34 are electrically separated by a non-conducting gap 33 at the center of the transducer. Gap 33 is positioned at a radius r measured from the center of hub 2. The radius of hub 2 is marked a and the radius to the inner surface of movable outer rim 4 is marked 1. Radius r indicates the distance from the center of the hub to the low stress region of the spoke where gap 33 is positioned.

The low stress region or nodal point of the spoke is located near the geometric center of the spoke. For some situations, the geometric center may be used for locating the gap in the drive transducer. It will be understood by those skilled in the art that a precise location of the nodal point can be obtained analytically or graphically, by constructing a moment diagram for the spoke.

The manner of constructing an actuator or transducer for either motor is clearly seen in the cross-sectional view of FIG. 4. There, the side of transducer 31 lying next to the spoke has a unitary conducting back electrode surface 36. A pair of conducting electrode surfaces 32 and 34 are located on the opposite, outward facing surface of the element. The side of element 30 carrying electrode 36 is preferably bonded to spoke 6 by means of a layer of insulating epoxy 44. This layer, because it is does not have to be metal-filled, can be made appreciably stronger than conductive epoxy layer 18 of FIG. 2. Epoxy layer 44 is preferably applied to spoke 6 in the form of an epoxy impregnated fiberglass or nylon mat. Structures of this kind are available in uncured form, needing only to be cut by scissors, applied, and cured, in order to produce the desired bond to couple spoke 6 and transducer 31. Electrodes 32, 34 and 36 may be made in the same way as those in FIGS. 1 and 2.

A typical drive transducer 31 may be a thin square slab of the same substance as was used in drive element 8 of FIGS. 1 and 2. The element 30 may be approximately 0.4 inches on a side and 0.02 inches thick. Gap 33 is about 0.035 inches and the angle of end tapers 46 is about 15°. To prevent damage in handling, the sharp edges of tapered ends 46 are removed.

Gap 33 between electrodes 32 and 34 need be only wide as the element is thick. While it would be expected that, in order to minimize the risk of arc-over between electrodes 32 and 34, the width of gap 33 should be twice the thickness of element 30, it has been found that this precaution is unnecessary. In fact, it has been found advantageous to make the gap as small as possible because it improves sensitivity of the piezoelectric transducer structure, because of shear. This is because piezoelectric shear is enhanced and a greater deflection is applied to the spoke by action of the transducer. Also, it has been found convenient to apply electrodes 32 and 34 as a single continuous electrode and then to produce gap 33 by etching the surface chemically to produce separate electrodes of substantially the same area.

Another feature of the invention is the provision of tapered ends 46 at either end of piezoelectric element 30. By tapering the ends of the element, strain resulting from coupling the mechanical action to spoke 6 is graduated at the ends of the transducer. Each tapered end has the effect of distributing shear force in the adhesive over a substantial portion of the crystal length, as compared with the concentration of stress which occurs when square ends are used. It has been found, by calculating the stresses in the element at the point of strain concentration at either of the outer, obtuse angled corners, that, to produce a stress below the limit of 4000 psi. set by the material strength of a lead-zirconium titanate crystal, while minimizing crystal thickness, the preferred angle for the taper of the ends is about 15°.

In operation, the effect of applying voltages to electrodes 32 and 34 is to oppositely stress the ends of piezoelectric element 30. Because the element has been prepolarized (as was the case in the prior art crystal), the entire length of the element reacts by deforming to an S-shape. Reversal of the applied polarity reverses the direction of the S-shape. The use of an AC voltage, therefore, is effective to drive the ends of spoke 6 back and forth and results in the desired dither motion of outer rim 4 relative to hub 6. Also, the effect of applying opposite voltages to electrodes 32 and 34 is to make electrode 36, on the other side of element 30, into a virtual ground. As a result, no voltage from the drive appears across insulating epoxy 44 between back electrode 36 and spoke 6. This balanced design eliminates ground contacts and permits the use of light weight push-pull amplifiers in place of isolation transformers.

While the invention has been described above in a preferred embodiment employing particular materials and a particular, illustrative configuration, it will be apparent that the teachings of the invention may be applied by using other materials and forms of construction known in the art. The below appended claims should, therefore, be construed in keeping with the spirit of invention, rather than being limited to the specific details shown above.

What is claimed is:

1. In a drive motor for dithering a ring laser gyroscope having a hub, a movable outer rim, at least one elongate, flexible spoke connecting the hub to the outer rim, and at least one transducer attached to the spoke for deflecting the spoke, the improvement comprising:

the transducer consisting of a piezoelectric element having a single electrode on the side of the element which is attached to the spoke, and a pair of electrodes on the opposite side, one electrode of the pair located nearer to the hub and the other located nearer to the rim; and means for applying a drive voltage to only the pair of electrodes.

2. In a drive motor in accordance with claim 1, the further improvement comprising:

the pair of electrodes being separated at the center of mechanical action of the transducer by a gap and the gap being centered on a low stress region of the spoke.

3. In a drive motor in accordance with claim 1, the further improvement comprising:

the surfaces of the ends of the piezoelectric element away from the gap being tapered towards the spoke.

4. In a drive motor in accordance with claim 3, the further improvement comprising each end surface being tapered at an angle of approximately 15° from a side of the element.

5. In a drive motor in accordance with claim 1, the further improvement comprising:

the pair of electrodes being symmetrically disposed on either side of a low stress region of the spoke are having substantially equal surface areas.

6. In a drive motor in accordance with claim 1, the further improvement comprising the side of the transducer having the single electrode being fastened to the spoke by an electrically insulating adhesive.

7. In a drive motor in accordance with any one of claims 1-6, the further improvement comprising:

a push-pull amplifier connected to the pair of electrodes.

* * * * *